United States Patent [19]

Mahabadi

[11] Patent Number: 5,059,922

[45] Date of Patent: Oct. 22, 1991

[54] HIGH SPEED LOW OFFSET CMOS AMPLIFIER WITH POWER SUPPLY NOISE ISOLATION

[75] Inventor: John K. Mahabadi, Tempe, Ariz.

[73] Assignee: Motorola, Inc., Schaumburg, Ill.

[21] Appl. No.: 615,117

[22] Filed: Nov. 19, 1990

[51] Int. Cl.$^5$ ............................................. H03F 3/30
[52] U.S. Cl. .................................... 330/264; 330/265
[58] Field of Search ................ 330/264, 265; 307/451, 307/469

[56] References Cited

FOREIGN PATENT DOCUMENTS 2425918 12/1974 Fed. Rep. of Germany ...... 330/264
114160 9/1979 Japan .................................. 330/264

Primary Examiner—James B. Mullins
Attorney, Agent, or Firm—Robert D. Atkins

[57] ABSTRACT

A single-ended amplifier circuit is provided combining high speed operation with low input offset characteristics while providing immunity from power supply noise for the input signal by isolating the power supply conductors from the input conductor. The first and second amplifying transistors are separated from the power supply conductors by the drain-source conduction paths of third and fourth isolation transistors operating in their linear region in response to a predetermined reference potential. Thus, any power supply noise is absorbed across the third and fourth isolation transistors thereby avoiding overwhelming a low level input signal with switching induced noise.

22 Claims, 1 Drawing Sheet

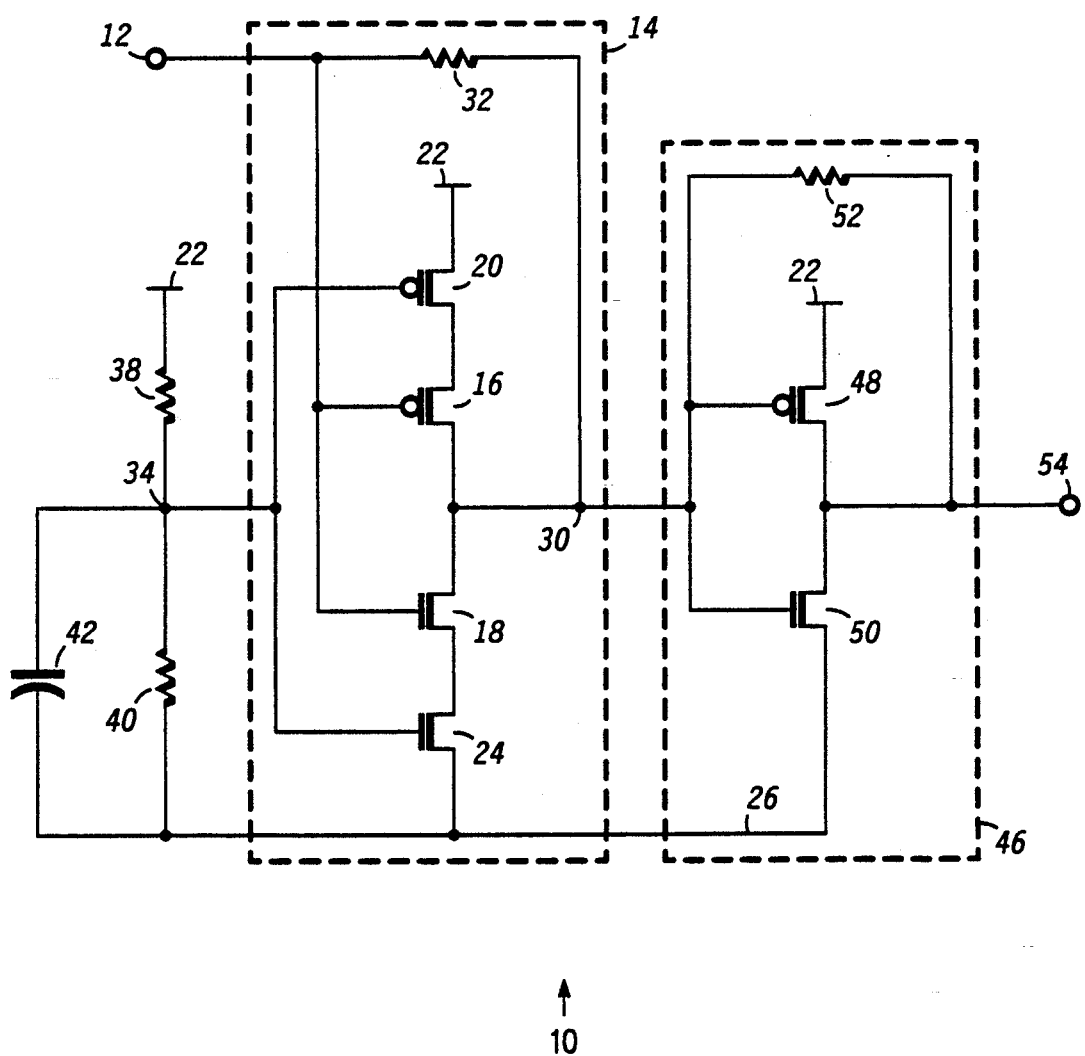

HIGH SPEED LOW OFFSET CMOS AMPLIFIER WITH POWER SUPPLY NOISE ISOLATION

FIELD OF THE INVENTION

This invention relates in general to a high frequency low offset amplifier providing isolation for a low level input signal from power supply noise.

BACKGROUND OF THE INVENTION

Amplifier circuits are commonplace in modern electronic design. Some desirable features for a single-ended amplifier circuit include high speed operation with a low input offset voltage. For example, the specifications of the amplifier may require operation in the Intermediate Frequency (IF) band with an input signal in the millivolt range. It is desirable to have a substantially zero input offset voltage for the amplifier with such low level input signals. Otherwise, the input signal may not reach a sufficient level to activate the output signal of the amplifier. Another consideration for an amplifier operating with small input signals is the noise level on the power supply conductors, wherein the power supply noise may feed through and overwhelm the low level input signal. Given such restrictive specifications, the prior art has typically employed linear bipolar technology to achieve the low offset voltage and power supply noise isolation since single-ended MOS amplifiers with low level input signals historically have been susceptible to noise.

In many applications, it is necessary to amplify the low level analog input signal to digital levels for further processing through digital circuits. The digital circuits are typically implemented with MOS technology because of the low power consumption while high speed linear circuits are bipolar in design. Thus, conventional practice has taught either using separate bipolar and MOS integrated circuit (IC) chips for the amplifier and digital logic functions, respectively, thereby maintaining a single technology per IC, or combining bipolar and MOS technologies onto a single application specific integrated circuit (ASIC). However, both of these options increase the overall cost as compared to a single technology design for both the linear and digital circuits on one integrated circuit.

Hence, what is needed is an improved single-ended amplifier circuit implemented in MOS technology combining high speed operation with a low offset voltage for low level input signals while providing noise isolation from the power supply conductors.

SUMMARY OF THE INVENTION

Briefly stated, the invention comprises an amplifier circuit having an input coupled for receiving an input signal and an output for providing an output signal. A first circuit includes an input coupled to the input of the amplifier circuit for amplifying the input signal and an output for providing the output signal. The first circuit also includes a first terminal coupled for receiving a first operating potential and a second terminal coupled for receiving a second operating potential. A second circuit is coupled between a first source of operating potential and the first terminal of the first circuit and operating in response to a reference potential for providing noise isolation therebetween, while a third circuit is coupled between a second source of operating potential and the second terminal of the first circuit and operating in response to the reference potential for providing noise isolation therebetween. A feedback circuit is coupled between the output and the input of the first circuit for controlling the amplification of the first circuit. First and second resistors are serially coupled between the first and second sources of operating potential for developing the reference potential at the interconnection thereof, and a capacitor coupled between the interconnection of the first and second resistors and the second source of operating potential.

In another aspect, the present invention is an integrated circuit having an amplifier circuit with an input coupled for receiving an input signal and an output for providing an output signal comprising first and second transistors each having a gate coupled to the input of the amplifier circuit. A circuit develops a fixed reference potential. A third transistor has a source coupled to a first source of operating potential, a drain coupled to the source of the first transistor, and a gate coupled for receiving the fixed reference potential for maintaining the third transistor in a linear region of operation for reducing noise coupling between the first source of operating potential and the source of the first transistor. A fourth transistor includes a source coupled to a second source of operating potential, a drain coupled to the source of the second transistor, and a gate coupled for receiving the fixed reference potential for maintaining the fourth transistor in a linear region of operation for reducing noise coupling between the second source of operating potential and the source of the second transistor. A feedback circuit is coupled between the drains of the first and second transistors and the gates of the first and second transistors for controlling the amplification through the first and second transistors.

In yet another aspect, the present invention is a method of increasing the amplitude of an input signal applied at an input of an amplifier circuit comprising the steps of amplifying the input signal with first and second operating potentials for providing an output signal, isolating the first operating potential from the input signal with a first transistor operating in its linear region in response to a fixed reference potential for reducing the noise coupled therebetween, isolating the second operating potential from the input signal with a second transistor operating in its linear region in response to the fixed reference potential for reducing the noise coupled therebetween, and feeding back the output signal to the input of the amplifier circuit for controlling the amplification of the input signal.

The present invention includes a single-ended amplifier circuit implemented in MOS technology combining high speed operation and low input offset characteristics while providing immunity from power supply noise for the input signal by isolating the input signal from the power supply conductors. The first and second amplifying transistors are separated from the power supply conductors by the drain-source conduction paths of third and fourth isolation transistors operating in their linear regions in response to a predetermined reference potential. Thus, any power supply noise is absorbed across the third and fourth isolation transistors thereby avoiding overwhelming a low level input signal with switching induced noise.

BRIEF DESCRIPTION OF THE DRAWING

The sole FIGURE is a schematic diagram illustrating the preferred embodiment of the present invention.

DETAILED DESCRIPTION OF THE PREFERRED EMBODIMENT

Referring to the sole FIGURE, there is shown single-ended amplifier circuit 10 suitable for manufacturing in monolithic integrated circuit form using conventional MOS integrated processes. A low level analog input signal, say 20 millivolts, is applied at input 12 of amplifier section 14 at the gates of transistors 16 and 18. The source of transistor 16 is coupled through the drain-source conduction path of transistor 20 to power supply conductor 22 typically operating at a positive potential such a $V_{DD}$. Likewise, the source of transistor 18 is coupled through the drain-source conduction path of transistor 24 to power supply conductor 26 typically operating at ground potential. The drains of transistors 16 and 18 are coupled together at node 30 that is the output of amplifier section 14. Node 30 is also coupled through feedback resistor 32 to the gates of transistors 16 and 18 for controlling the gain of amplifier section 14. The gates of transistors 20 and 24 are responsive to a reference potential developed at node 34 by way of the resistor divider network formed of resistors 38 and 40 coupled between power supply conductors 22 and 26. Capacitor 42 is coupled between node 34 and power supply conductor 26 for filtering the high frequency noise feeding through transistors 20 and 24 to node 34.

The output of amplifier section 14 is also coupled to the input of amplifier section 46 at the gates of transistors 48 and 50. The source of transistor 48 is coupled to power supply conductor 22, while the source of transistor 50 is coupled to power supply conductor 26. The drains of transistors 48 and 50 are coupled together through feedback resistor 52 to the gates thereof for limiting the gain of amplifier section 46. The output of amplifier circuit 10 is provided at node 54 at the drains of transistors 48 and 50.

The substrate of the integrated circuit comprising amplifier circuit 10, that is power supply conductor 26, often includes hundreds of millivolts of power supply noise principally due to high speed switching currents from surrounding digital logic circuits disposed on the same substrate (not shown). Similar noise may appear on power supply conductor 22. Most if not all conventional single-ended CMOS amplifiers have been unable to isolate the power supply noise from the input conductor, thus limiting the low operative level input signal. As part of the present invention MOS transistors 20 and 24 are coupled between power supply conductor 22 and 26 and transistors 16 and 18, respectively, for providing isolation therebetween.

A reference potential is developed at node 34 of say 2.5 volts from the resistor divider combination of resistors 38 and 40. Capacitor 42 filters the high frequency components at node 34 for providing a stable reference signal at the gates of transistors 20 and 24. Hence, transistor 20 is continuously operating in its linear region for providing isolation between power supply conductor 22 and the source of transistor 16. Likewise, transistor 24 also operates in its linear region for providing isolation between power supply conductor 26 and the source of transistor 18. A typical drain-source resistance for transistors 20 and 24 is 200 ohms with 200 millivolts of potential thereacross. Any switching induced noise appearing on power supply conductors 22 and 26 is substantially absorbed across the drain-source conduction path of transistors 20 and 24 thereby removing such interference from the gates of transistors 16 and 18.

Transistors 16 and 18 are operated in saturation such that the analog input signal applied at input 12 is amplified through amplifier section 14 to node 30. Feedback resistor 32 is provided for limiting the open loop gain and improving the stability of amplifier section 14. A typical value for resistor 32 is 15K ohms. Thus, with an input impedance seen at the gates of transistors 16 and 18 of approximately 300 ohms, amplifier section 14 provides a close loop gain of approximately 50 (15K/300). The high speed, low power operation is inherit in the CMOS design and the low input offset voltage is provided by biasing transistors 16 and 18 in the mid-range between power supply conductors 22 and 26.

The output signal of amplifier section 14 is applied at the input of amplifier section 46 for providing additional amplification to drive the analog input signal to the rails of power supply conductors 22 and 26 thereby converting it to a digital signal at node 54. Transistors 48 and 50 also operate in saturation while feedback resistor 52 limits the gain of amplifier section 46. The isolation transistors like 20 and 24 are omitted from amplifier section 46 since the magnitude of the signal appearing at node 30 is well above the noise floor of power supply conductors 22 and 26. It is understood that amplifier sections like 14 may be cascaded after node 30. The same is true of amplifier section 46. Furthermore, inverter circuits formed of transistors like 48 and 50 without resistor 52 may be cascaded after node 54 for providing buffering of the output signal of amplifier circuit 10. The additional amplifier stages are also biased in the mid-range between power supply conductors 22 and 26 for providing high speed operation and amplification.

Hence, what has been provided is a novel amplifier circuit implemented in MOS technology having high speed operation and low input offset characteristics while providing immunity from power supply noise for the input signal by isolating the power supply conductors from the input conductor.

I claim:

1. An amplifier circuit having an input coupled for receiving an input signal and an output for providing an output signal, comprising:

first means having an input coupled to the input of the amplifier circuit for amplifying the input signal and having an output for providing the output signal, said first means including a first terminal coupled for receiving a first operating potential and a second terminal coupled for receiving a second operating potential;

second means coupled between a first source of operating potential and said first terminal of said first means and operating in response to a reference potential for providing noise isolation therebetween;

third means coupled between a second source of operating potential and said second terminal of said first means and operating in response to said reference potential for providing noise isolation therebetween;

feedback means coupled between said output and said input of said first means for controlling the amplification of said first means;

first and second resistors serially coupled between said first and second sources of operating potential for developing said reference potential at the interconnection thereof; and a capacitor coupled between the interconnection of said first and second resistors and said second source of operating potential.

2. The amplifier circuit of claim 1 wherein said first means includes:
   a first transistor having a gate, a drain and a source, said gate being coupled to said input of said first means, said source being coupled to said first terminal of said first means, said drain being coupled to said output of said first means; and
   a second transistor having a gate, a drain and a source, said gate being coupled to said input of said first means, said source being coupled to said second terminal of said first means, said drain being coupled to said output of said first means.

3. The amplifier circuit of claim 2 wherein said first and second transistors are MOS transistors.

4. The amplifier circuit of claim 3 wherein said second means includes a third transistor having a gate, a drain and a source, said gate being coupled for receiving said reference potential, said source being coupled to said first source of operating potential, said drain being coupled to said source of said first transistor.

5. The amplifier circuit of claim 4 wherein said third means includes a fourth transistor having a gate, a drain and a source, said gate being coupled for receiving said reference potential, said source being coupled to said second source of operating potential, said drain being coupled to said source of said second transistor.

6. The amplifier circuit of claim 5 wherein said third and fourth transistors are MOS transistors.

7. The amplifier circuit of claim 6 wherein said feedback means includes a third resistor coupled between said drains of said first and second transistors and said gates of said first and second transistors.

8. The amplifier circuit of claim 7 further including:
   a fifth transistor having a gate, a drain and a source, said gate being coupled to said drains of said first and second transistors, said source being coupled to said first source of operating potential, said drain being coupled to the output of the amplifier circuit; and
   a sixth transistor having a gate, a drain and a source, said gate being coupled to said drains of said first and second transistors, said source being coupled to said second source of operating potential, said drain being coupled to the output of the amplifier circuit.

9. The amplifier circuit of claim 8 further including a fourth resistor coupled between said drains of said fifth and sixth transistors and said gates of said fifth and sixth transistors.

10. In an integrated circuit an amplifier circuit having an input coupled for receiving an input signal and an output for providing an output signal, comprising:
    first and second transistors each having a drain, source and a gate, said gates of said first and second transistors being coupled to the input of the amplifier circuit;
    circuit means for developing a fixed reference potential;
    a third transistor having a gate, a drain and a source, said source being coupled to a first source of operating potential, said drain being coupled to said source of said first transistor, said gate being coupled for receiving said fixed reference potential for maintaining said third transistor in a linear region of operation for reducing noise coupling between said first source of operating potential and said source of said first transistor;
    a fourth transistor having a gate, a drain and a source, said source being coupled to a second source of operating potential, said drain being coupled to said source of said second transistor, said gate being coupled for receiving said fixed reference potential for maintaining said fourth transistor in a linear region of operation for reducing noise coupling between said second source of operating potential and said source of said second transistor; and
    feedback means coupled between said drains of said first and second transistors and said gates of said first and second transistors for controlling the amplification through said first and second transistors.

11. The amplifier circuit of claim 10 wherein said feedback means includes a first resistor coupled between said drains of said first and second transistors and said gates of said first and second transistors.

12. The amplifier circuit of claim 11 wherein said circuit means includes:
    second and third resistors serially coupled between said first and second sources of operating potential wherein said reference potential is developed at the interconnection thereof; and
    a capacitor coupled between the interconnection of said second and third resistors and said second source of operating potential.

13. The amplifier circuit of claim 12 further including:
    a fifth transistor having a gate, a drain and a source, said gate being coupled to said drains of said first and second transistors, said source being coupled to said first source of operating potential, said drain being coupled to the output of the amplifier circuit; and
    a sixth transistor having a gate, a drain and a source, said gate being coupled to said drains of said first and second transistors, said source being coupled to said second source of operating potential, said drain being coupled to the output of the amplifier circuit.

14. The amplifier circuit of claim 13 further including a fourth resistor coupled between said drains of said fifth and sixth transistors and said gates of said fifth and sixth transistors.

15. A method of increasing the amplitude of an input signal applied at an input of an amplifier circuit, comprising the steps of:
    amplifying the input signal with first and second operating potentials for providing an output signal;
    isolating said first operating potential from the input signal with a first transistor operating in its linear region in response to a fixed reference potential for reducing the noise coupled therebetween;
    isolating said second operating potential from the input signal with a second transistor operating in its linear region in response to said fixed reference potential for reducing the noise coupled therebetween; and
    feeding back said output signal to the input of the amplifier circuit for controlling said amplification of the input signal.

16. An integrated circuit including an amplifier circuit having an input coupled for receiving an input signal and an output for providing an output signal, comprising:

first means having an input coupled to the input of the amplifier circuit for amplifying the input signal and having an output for providing the output signal, said first means including a first terminal coupled for receiving a first operating potential and a second terminal coupled for receiving a second operating potential;

second means coupled between a first source of operating potential and said first terminal of said first means and operating in response to a reference potential for providing noise isolation therebetween;

third means coupled between a second source of operating potential and said second terminal of said first means and operating in response to said reference potential for providing noise isolation therebetween;

feedback means coupled between said output and said input of said first means for controlling the amplification of said first means;

first and second resistors serially coupled between said first and second sources of operating potential for developing said reference potential at the interconnection thereof; and a capacitor coupled between the interconnection of said first and second resistors and said second source of operating potential.

17. The integrated circuit of claim 16 wherein said first means includes:

a first transistor having a gate, a drain and a source, said gate being coupled to said input of said first means, said source being coupled to said first terminal of said first means, said drain being coupled to said output of said first means; and a second transistor having a gate, a drain and a source, said gate being coupled to said input of said first means, said source being coupled to said second terminal of said first means, said drain being coupled to said output of said first means.

18. The integrated circuit of claim 17 wherein said first and second transistors are MOS transistors.

19. The integrated circuit of claim 18 wherein said second means includes a third transistor having a gate, a drain and a source, said gate being coupled for receiving said reference potential, said source being coupled to said first source of operating potential, said drain being coupled to said source of said first transistor.

20. The integrated circuit of claim 19 wherein said third means includes a fourth transistor having a gate, a drain and a source, said gate being coupled for receiving said reference potential, said source being coupled to said second source of operating potential, said drain being coupled to said source of said second transistor.

21. The integrated circuit of claim 20 wherein said third and fourth transistors are MOS transistors.

22. The integrated circuit of claim 21 wherein said feedback means includes a third resistor coupled between said drains of said first and second transistors and said gates of said first and second transistors.

* * * * *